(12) United States Patent
Liu et al.

(10) Patent No.: US 8,455,975 B2
(45) Date of Patent: *Jun. 4, 2013

(54) PARASITIC PNP BIPOLAR TRANSISTOR IN A SILICON-GERMANIUM BICMOS PROCESS

(75) Inventors: Donghua Liu, Shanghai (CN); Wensheng Qian, Shanghai (CN)

(73) Assignee: Shanghai Hua Hong NEC Electronics Co., Ltd., Shanghai (CN)

( * ) Notice: Subject to any disclaimer, the term of this patent is extended or adjusted under 35 U.S.C. 154(b) by 0 days.

This patent is subject to a terminal disclaimer.

(21) Appl. No.: 13/228,305

(22) Filed: Sep. 8, 2011

(65) Prior Publication Data
US 2012/0061793 A1  Mar. 15, 2012

(30) Foreign Application Priority Data
Sep. 10, 2010 (CN) .......................... 2010 1 0278159

(51) Int. Cl.
*H01L 29/02* (2006.01)
*H01L 29/10* (2006.01)
*H01L 29/40* (2006.01)
*H01L 29/47* (2006.01)
*H01L 29/66* (2006.01)

(52) U.S. Cl.
USPC ............. 257/517; 257/47; 257/197; 257/474; 257/511; 257/E27.053; 257/E27.055

(58) Field of Classification Search
USPC .................. 257/47, 197, 474, 511, 517, 565, 257/E27.053, E27.055
See application file for complete search history.

(56) References Cited

U.S. PATENT DOCUMENTS

| 6,015,726 | A   | * | 1/2000 | Yoshida ......................... | 438/202 |
| 8,227,832 | B2  | * | 7/2012 | Chiu et al. ..................... | 257/156 |
| 2009/0179303 | A1 | * | 7/2009 | Heinemann et al. .......... | 257/586 |
| 2011/0140233 | A1 | * | 6/2011 | Qian et al. ..................... | 257/526 |
| 2011/0140239 | A1 | * | 6/2011 | Chiu et al. ..................... | 257/565 |
| 2011/0156143 | A1 | * | 6/2011 | Chiu et al. ..................... | 257/336 |
| 2011/0156202 | A1 | * | 6/2011 | Chiu et al. ..................... | 257/526 |

\* cited by examiner

*Primary Examiner* — Cheung Lee
*Assistant Examiner* — Jeremy Joy
(74) *Attorney, Agent, or Firm* — Blakely Sokoloff Taylor & Zafman

(57) ABSTRACT

A parasitic PNP bipolar transistor, wherein a base region includes a first and a second region; the first region is formed in an active area, has a depth larger than shallow trench field oxides, and has its bottom laterally extended into the bottom of the shallow trench field oxides on both sides of an active area; the second region is formed in an upper part of the first region and has a higher doping concentration; an N-type and a P-type pseudo buried layer is respectively formed at the bottom of the shallow trench field oxides; a deep hole contact is formed on top of the N-type pseudo buried layer to pick up the base; the P-type pseudo buried layer forms a collector region separated from the active area by a lateral distance; an emitter region is formed by a P-type SiGe epitaxial layer formed on top of the active area.

7 Claims, 6 Drawing Sheets

PARASITIC PNP BIPOLAR TRANSISTOR IN A SILICON-GERMANIUM BICMOS PROCESS

CROSS-REFERENCES TO RELATED APPLICATIONS

This application claims the priority of Chinese patent application number 201010278159.1, filed on Sep. 10, 2010, the entire contents of which are incorporated herein by reference.

TECHNICAL FIELD

The present invention relates to a semiconductor integrated circuit device, and particularly relates to a parasitic PNP bipolar transistor in a silicon-germanium BiCMOS process.

BACKGROUND OF THE INVENTION

In the applications of radio frequency (RF), a higher cut-off frequency is always required. Although an RFCMOS can achieve a relatively high frequency by using an advanced process, it still can not fully meet the requirements of radio frequency, for example, it is difficult to achieve a cut-off frequency above 40 GHz. Besides, the cost for research and development of advanced process is rather high.

It is known that compound semiconductors can be used to manufacture devices with very high cut-off frequencies. However, the application of compound semiconductors is limited because of their disadvantages such as high cost, small size, and poisonousness.

In recent years, silicon-germanium heterojunction bipolar transistor (SiGe HBT) has become a good choice for super high frequency devices for the following reasons: firstly, due to the difference between the energy bands of silicon-germanium (SiGe) and silicon (Si), the carrier injection efficiency of the emitter region is increased, and the current amplification performance of the device is improved; secondly, the heavily doped SiGe base region can reduce the base resistance and increase the cut-off frequency; thirdly, the SiGe process is basically compatible with the silicon process and is not high in cost. Therefore, SiGe HBT has become a main force of super high frequency devices.

A PNP bipolar transistor is an important device of the silicon-germanium BiCMOS (SiGe BiCMOS) process other than a SiGe NPN HBT. In a conventional SiGe BiCMOS process, a PNP device is designed to have a lateral structure for easy pick up of the collector region formed in the P-well. However, the greatest weakness of a lateral PNP transistor is that the width of the base region is large and the current-gain is small.

SUMMARY OF THE INVENTION

One objective of the present invention is to provide a parasitic PNP bipolar transistor in a silicon-germanium BiCMOS process, which can greatly reduce the device area, improve the current amplification system of the device, make it feasible to easily adjust the breakdown voltage by changing the layout, and make the manufacturing process compatible with the silicon-germanium BiCMOS process.

To achieve the above objective, the present invention provides a parasitic PNP bipolar transistor in a silicon-germanium BiCMOS process, which is formed on a P-type silicon substrate; in the substrate, an active area is isolated by shallow trench field oxides, the PNP bipolar transistor comprises:

a base region, composed of a first region and a second region; the first region is formed by a first N-type ion implantation region in the active area; the first region has a depth larger than that of the bottom of the shallow trench field oxides; a bottom part of the first region laterally extends into the bottom of the shallow trench field oxides on both sides of the active area; the second region is formed by a second N-type ion implantation region formed in an upper part of the first region; the second region has a doping concentration higher than that of the first region and a depth smaller than that of the bottom of the shallow trench field oxides;

an N-type pseudo buried layer, formed by a third N-type ion implantation region formed at the bottom of the shallow trench field oxide on one side of the active area; the N-type pseudo buried layer is in contact with the first region; a base electrode is picked up through a deep hole contact formed on top of the N-type pseudo buried layer in the respective shallow trench field oxide;

a collector region, formed by a P-type pseudo buried layer formed at the bottom of the shallow trench field oxide on the other side of the active area; the P-type pseudo buried layer is separated from the active area by a lateral distance; the P-type pseudo buried layer is in contact with the bottom part of the first region that laterally extends into the bottom of the shallow trench field oxides; a collector electrode is picked up through a deep hole contact formed on top of the P-type pseudo buried layer in the respective shallow trench field oxide, wherein by adjusting the lateral distance between the P-type pseudo buried layer and the active area, a bottom width of the bottom of the first region can be adjusted, and hence a breakdown voltage of the parasitic PNP bipolar transistor can be adjusted;

an emitter region, which is formed by a P-type silicon-germanium epitaxial layer formed on top of the active area and is in contact with the second region; an emitter electrode is picked up by a metal contact.

According to a preferred embodiment, the first N-type ion implantation of the first region adopts the process for forming an N-type collector region in a SiGe NPN HBT with the following process conditions: implantation dose is 1e12 cm$^{-2}$ to 5e14 cm$^{-2}$; implantation energy is 50 KeV to 500 KeV; implantation window has a width larger than that of the active area. The width of the implantation window should be selected to make sure that the PN junction of the collector region and the base region is properly formed; the implantation energy should be selected to make sure that good contacts are formed between the first region and the N-type pseudo buried layer as well as between the first region and the P-type pseudo buried layer. The process conditions of the second N-type ion implantation of the second region are as follows: single implantation or multiple implantations; total implantation dose is 5e12 cm$^{-2}$ to 1e14 cm$^{-2}$; implantation energy is 10 KeV to 100 KeV; implantation window has a width smaller than or equal to that of the active area.

According to a preferred embodiment, the N-type pseudo buried layer is formed by a third N-type ion implantation conducted before forming the shallow trench field oxides, and the process conditions of the third N-type ion implantation are as follows: impurity implanted is arsenic or phosphorous; implantation dose is larger than 5e14 cm$^{-2}$: implantation energy is 1 KeV to 100 KeV.

According to a preferred embodiment, the P-type pseudo buried layer of the collector region is formed by a P-type ion implantation conducted before forming the shallow trench field oxides, and the process conditions of the P-type ion implantation are as follows: impurity implanted is boron or boron difluoride; implantation dose is 1e13 cm$^{-2}$ to 1e16 cm$^{-2}$; implantation energy is 1 KeV to 100 KeV.

According to a preferred embodiment, the P-type silicon-germanium epitaxial layer is doped by an ion implantation process with conditions as follows: implantation dose is larger than 1e15 cm$^{-2}$; impurity implanted is boron or boron difluoride; implantation energy is configured such that the impurities implanted can go through the P-type silicon-germanium epitaxial layer and enter into the active area below the P-type silicon-germanium epitaxial layer by a depth of 100 Å to 500 Å.

In the above structure, the deep hole contact is formed by opening a deep hole in the shallow trench field oxide, depositing a titanium/titanium nitride barrier metal layer in the deep hole, and tilling tungsten into the deep hole.

The device of the present invention has the following advantages:

1. By changing the lateral structure of an existing device to a vertical structure, the present invention is able to form the emitter region, base region and collector region of the device in one active area; by respectively picking up the base region and the collector region through a deep hole contact formed in the respective shallow trench field oxide on one side of the active area, the device area can be greatly reduced.

2. The base region of the present invention has an L-shaped structure composed of the first region and the second region; the width of the base region is determined by the depth of the shallow trench field oxides and the lateral distance between the P-type pseudo buried layer and the active area; compared with the existing parasitic PNP bipolar transistor with a lateral structure, the device of the present invention has a much smaller width of the base region, thus greatly increasing the current amplification factor of the device and improving the characteristics of the device.

3. In addition, by merely changing the layout of the device, it is very convenient to adjust the breakdown voltage of the device according to the present invention, as the breakdown voltage can be adjusted by adjusting the lateral distance between the P-type pseudo buried layer and the active area.

4. The manufacturing process of the device according to the present invention is compatible with conventional silicon-germanium BiCMOS process, and therefore, the manufacturing process is simple and has a low cost.

BRIEF DESCRIPTION OF THE DRAWINGS

The present invention will be further described and specified by using figures and implementation details in follows.

DETAILED DESCRIPTION OF THE INVENTION

Figure 1:
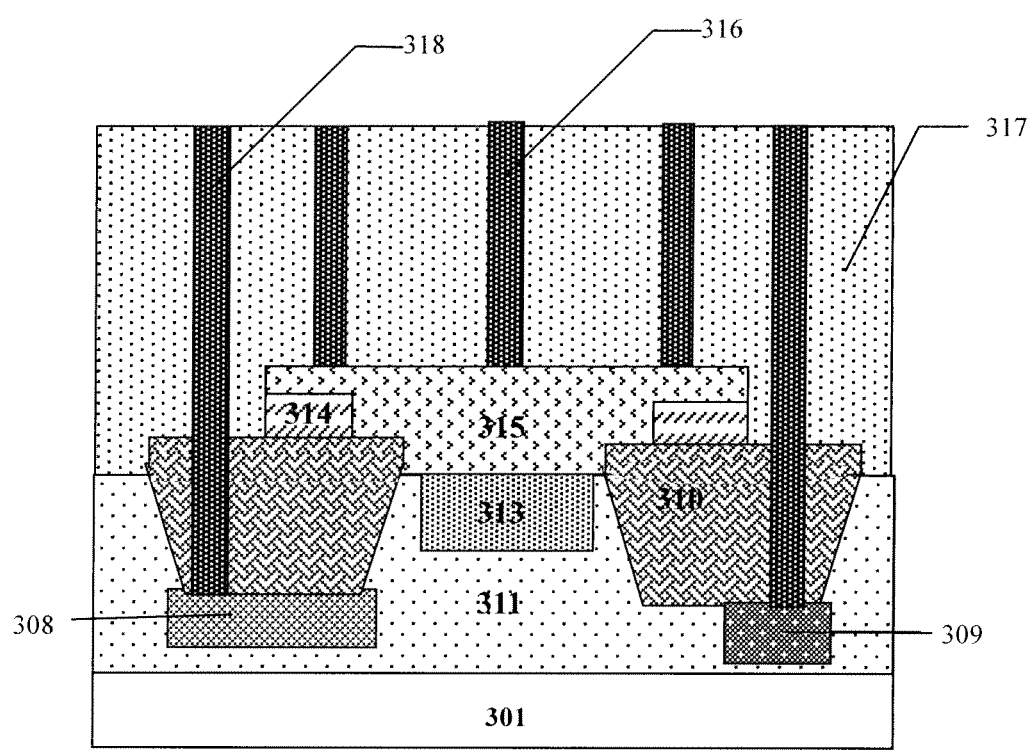
FIG. 1 is a structural view of the device according to one embodiment of the present invention.

FIG. 1 shows the structure of the device according to one embodiment of the present invention. The parasitic PNP bipolar transistor in a silicon-germanium BiCMOS process in the embodiment of the present invention is formed on a P-substrate 301, in which an active area is isolated by a first and a second shallow trench field oxide 310, the PNP bipolar transistor comprises:

A base region, composed of a first region 311 and a second region 313. The first region 311 is formed by a first N-type ion implantation region. The first region 311 has a depth larger than that of the bottom of the shallow trench field oxides 310.

A bottom part of the first region 311 laterally extends into the bottom of the shallow trench field oxides 310 on both sides of the active area. The second region 313 is formed by a second N-type ion implantation region formed in an upper part of the first region 311. The second region 313 has a doping concentration higher than that of the first region 311 and a depth smaller than that of the bottom of the shallow trench field oxides 310. The first N-type ion implantation of the first region 311 is formed by using the process for forming an N-type collector region in a SiGe NPN HBT process. The process conditions are as follows: the implantation dose is from 1e12 cm$^{-2}$ to 5e14 cm$^{-2}$; the implantation energy is from 50 KeV to 500 KeV; the implantation window has a width larger than that of the active area. The width of the implantation window should be selected to make sure that the PN junction of the collector region 309 and the base region is properly formed. The implantation energy should be selected to make sure that good contacts are formed between the first region 311 and the N-type pseudo buried layer 308 as well as between the first region 311 and the P-type pseudo buried layer. The process conditions of the second N-type ion implantation of the second region 313 are as follows: single implantation or multiple implantations; the total implantation dose is from 5e12 cm$^{-2}$ to 1 e14 cm$^{-2}$; the implantation energy is from 10 KeV to 100 KeV; the implantation window has a width smaller than or equal to that of the active area.

An N-type pseudo buried layer 308, which is formed by a third N-type ion implantation region formed at the bottom of the first shallow trench field oxide 310 on a first side of the active area. The N-type pseudo buried layer 308 is in contact with the first region 311, and a base electrode is picked up through a deep hole contact 318 formed on top of the N-type pseudo buried layer 308 in the first shallow trench field oxide 310. The N-type pseudo buried layer 308 is formed by a third N-type ion implantation into the bottom of the shallow trench before the formation of the first shallow trench field oxide 310. The process conditions of the third N-type ion implantation process are as follows: the impurity implanted is arsenic or phosphorous; the implantation dose is larger than 5e14 cm$^{-2}$; the implantation energy is from 1 KeV to 100 KeV.

A collector region 309, which is formed by a P-type pseudo buried layer formed at the bottom of the second shallow trench field oxide 310 on a second side of the active area. The P-type pseudo buried layer is separated from the active area by a lateral distance in the lateral direction. The P-type pseudo buried layer is in contact with the bottom part of the first region 311 that laterally extends into the bottom of the second shallow trench field oxide 310. The breakdown voltage of the parasitic PNP bipolar transistor can be adjusted by adjusting the width of the bottom of the first region 311 through adjusting the lateral distance between the P-type pseudo buried layer and the active area. A collector electrode is picked up through a deep hole contact 318 formed on top of the P-type pseudo buried layer in the second shallow trench field oxide 310. The P-type pseudo buried layer of the collector region 309 is formed by P-type ion implantation into the bottom of the shallow trench before the formation of the second shallow trench field oxide 310. The process conditions of the P-type ion implantation are as follows: the impurity implanted is boron or boron difluoride; the implantation dose is from 1e13 cm$^{-2}$ to 1e16 cm$^{-2}$; the implantation energy is from 1 KeV to 100 KeV.

An emitter region 315, which is formed by a P-type silicon-germanium epitaxial layer formed on top of the active area. The emitter region 315 is in contact with the second region 313, and an emitter electrode is picked up by a metal contact 316. The P-type silicon-germanium epitaxial layer is formed by using the process for forming a heavily doped P-type silicon-germanium extrinsic base region in a SiGe HBT process. The P-type silicon-germanium epitaxial layer is doped by using the P-type silicon-germanium extrinsic base ion implantation process in a SiGe HBT process. The process conditions are as follows: the implantation dose is larger than 1e15 cm$^{-2}$; the impurity implanted is boron or boron difluoride; the implantation energy is selected to make sure that the ions are able to go through the P-type silicon-germanium epitaxial layer and enter into the active area below the P-type silicon-germanium epitaxial layer by a depth of 100 Å to 500 Å, or in other words, reach a depth of 100 Å to 500 Å in the active area. An upper part of the emitter region 315 laterally extents over the shallow trench field oxides 310 on both sides of the active area. The extending parts of the upper part of the emitter region 315 are isolated from the shallow trench field oxide 310 by an extrinsic base dielectric layer 314.

In the above structure, the deep hole contact 318 is formed by opening a deep hole in the shallow trench field oxide 310, depositing a titanium/titanium nitride barrier metal layer in the deep hole, and filling tungsten into the deep hole. The deep hole contacts 318 and the metal contacts 316 further go through an interlayer film 317 to pick up the electrodes.

Figure 2A:
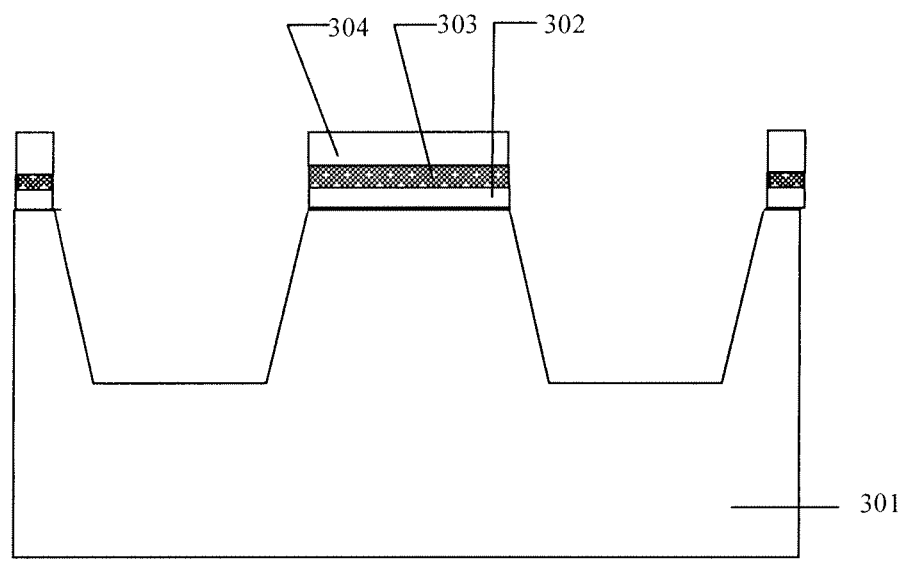
FIG. 2A to FIG. 2J are structural views of the device in steps of the manufacturing method according to one embodiment of the present invention.

FIG. 2A to FIG. 2J show the structures of the device in steps of the manufacturing method of an embodiment of the present invention. The manufacturing method of parasitic PNP bipolar transistor in a silicon-germanium BiCMOS process in the embodiment of the present invention comprises the following steps:

Step 1: as shown in FIG. 2A, grow in sequence a pad oxide layer 302, a silicon nitride layer 303 and an oxide layer 304 on a P-type silicon substrate 301.

Step 2: as shown in FIG. 2A, define an active area and etching shallow trenches. During the etching process, the active area is protected by a hard mask layer formed by the pad oxide layer 302, the silicon nitride layer 303 and the oxide layer 304.

Figure 2B:
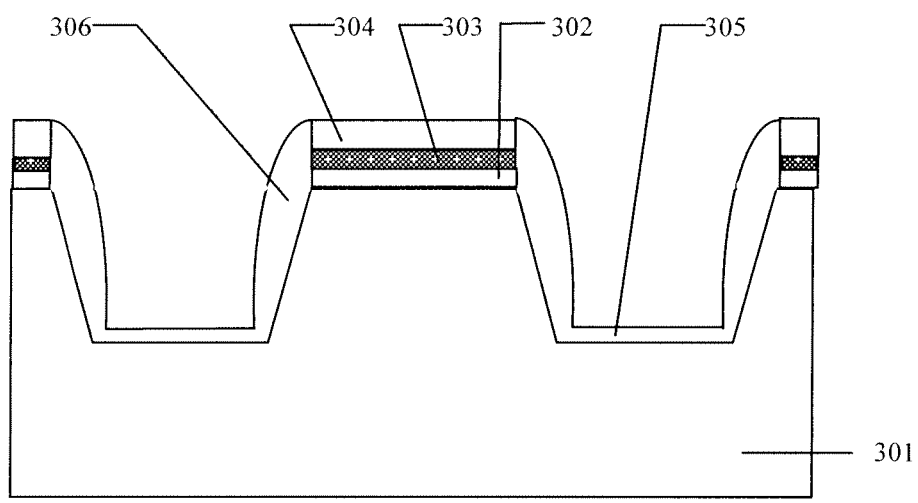

Step 3: as shown in FIG. 2B, form a pad layer 305 by thermal oxidation.

Step 4: as shown in FIG. 2B, deposit and etch a silicon oxide layer to form silicon oxide spacers 306 in the shallow trenches.

Figure 2C:
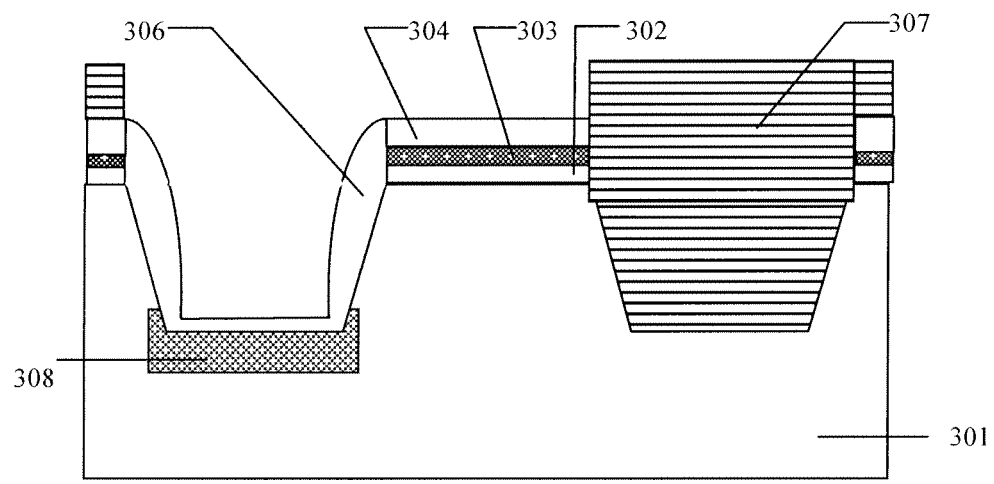

Step 5: as shown in FIG. 2C, open a window for the ion implantation of the N-type pseudo buried layer 308 (NBL) by photolithograph. In this embodiment, the ion implantation area of the NBL is at the bottom of the shallow trench on the left side of the active area. Areas other than the NBL ion implantation area are covered with photoresist 307.

Step 6: as shown in FIG. 2C, form the N-type pseudo buried layer 308 by conducting a third N-type ion implantation process at the bottom of the shallow trench with the following process conditions: the impurity implanted is arsenic or phosphorous; the implantation dose is larger than 5e14 cm$^{-2}$; the implantation energy is from 1 KeV to 100 KeV.

Figure 2D:
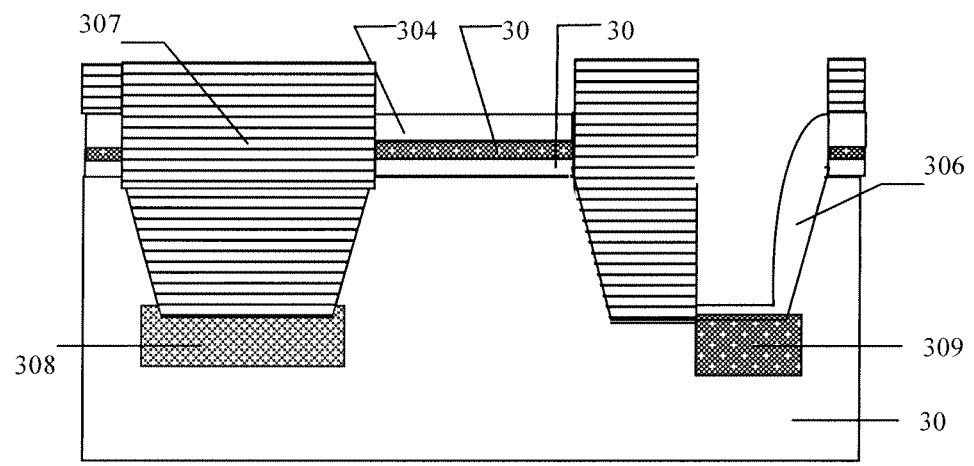

Step 7: as shown in FIG. 2D, open a window for the ion implantation of the P-type pseudo buried layer (PBL) by photolithograph. The ion implantation area of the PBL is at the bottom of the shallow trench on the right side of the active area and is separated from the active area by a lateral distance. Areas other than the PBL ion implantation area are covered with photoresist 307.

Step 8: as shown in FIG. 2D, form the P-type pseudo buried layer by conducting a P-type ion implantation at the bottom of the shallow trench. The P-type pseudo buried layer forms the collector region 309. The process conditions of the P-type ion implantation for forming the P-type pseudo buried layer are as follows: the implanted impurity is boron or boron difluoride; the implantation dose is from 1e13 cm$^{-2}$ to 1e16 cm$^{-2}$; the implantation energy is from 1 KeV to 100 KeV.

Figure 2E:
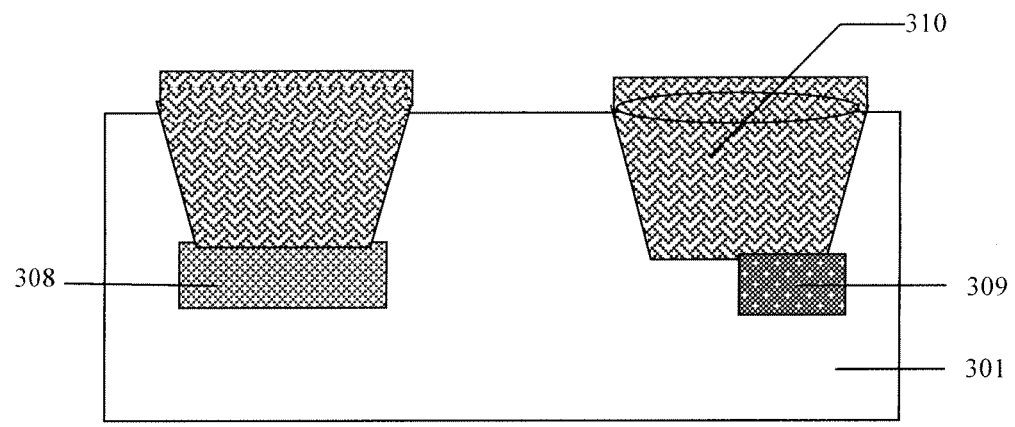

Step 9: as shown in FIG. 2E, remove the silicon oxide spacers 306; fill silicon oxide into the shallow trenches and planarize the surface by chemical mechanical polishing to form shallow trench field oxides 310.

Step 10: as shown in FIG. 2E, remove the oxide layer 304, the silicon nitride layer 303, and the pad oxide layer 302.

Figure 2F:
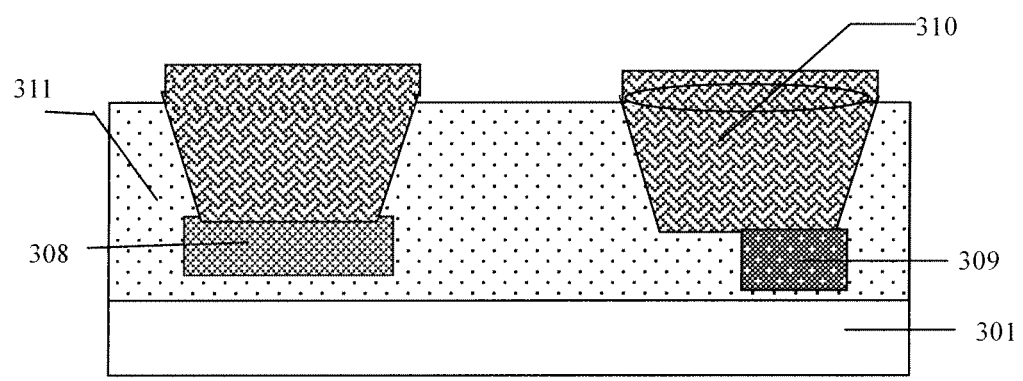

Step 11: as shown in FIG. 2F, form the first region 311 by conducting a first N-type ion implantation process in the active area of the substrate 301. The first N-type ion implantation process is conducted by using the process for forming an N-type collector region in a SiGe NPN HBT process. The process conditions are as follows: the implantation dose is from 1e12 cm$^{-2}$ to 5e14 cm$^{-2}$; the implantation energy is from 50 KeV to 500 KeV; the implantation window has a width larger than that of the active area; the width of the implantation window should be selected to make sure that a PN junction of the collector region 309 and the base region is properly formed; the implantation energy should be selected to make sure that good contacts are formed between the first region 311 and the N-type pseudo buried layer 308 as well as between the first region 311 and the P-type pseudo buried layer.

Figure 2G:
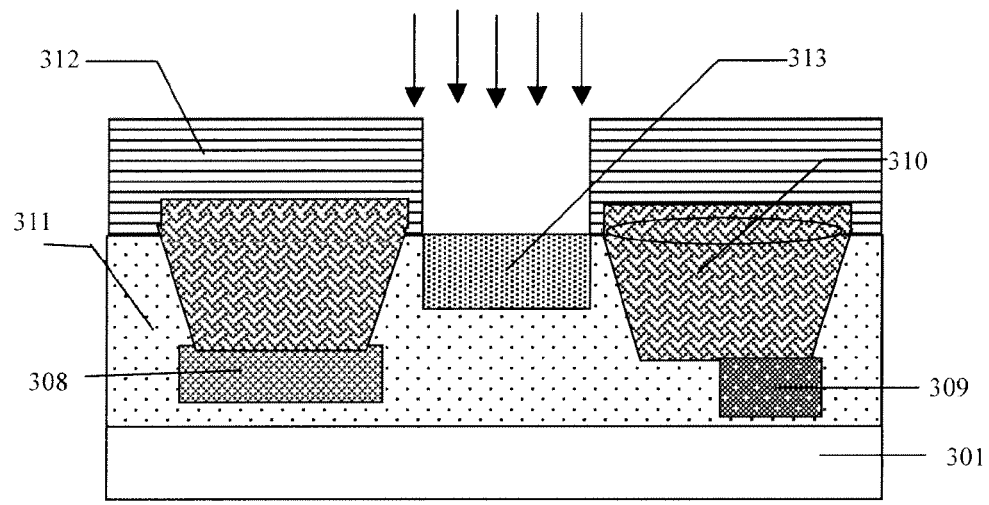

Step 12: as shown in FIG. 2G, define an implantation window of the second region by photolithograph. The implantation window of the second region has a width smaller than or equal to that of the active area. Areas other than the implantation area of the second region are covered with photoresist 312.

Step 13: as shown in FIG. 2G, form the second region 313 by conducting a second N-type ion implantation process with the following conditions: single implantation or multiple implantations; the total implantation dose is from 5e12 cm$^{-2}$ to 1e14 cm$^{-2}$; the implantation energy is from 10 KeV to 100 KeV.

Figure 2H:
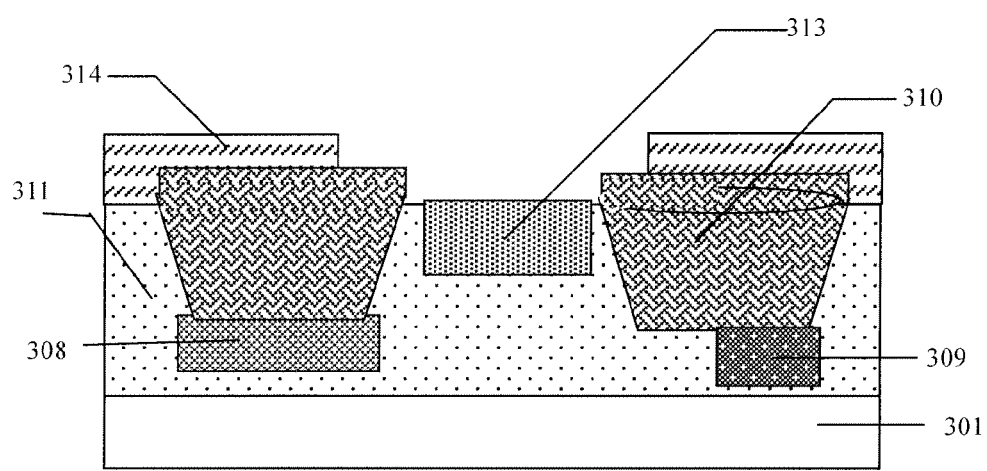

Step 14: as shown in FIG. 2H, deposit an extrinsic base dielectric layer 314 and etch part of the extrinsic base dielectric layer 314 to open an extrinsic base window for the formation of a silicon-germanium epitaxial layer.

Figure 2I:
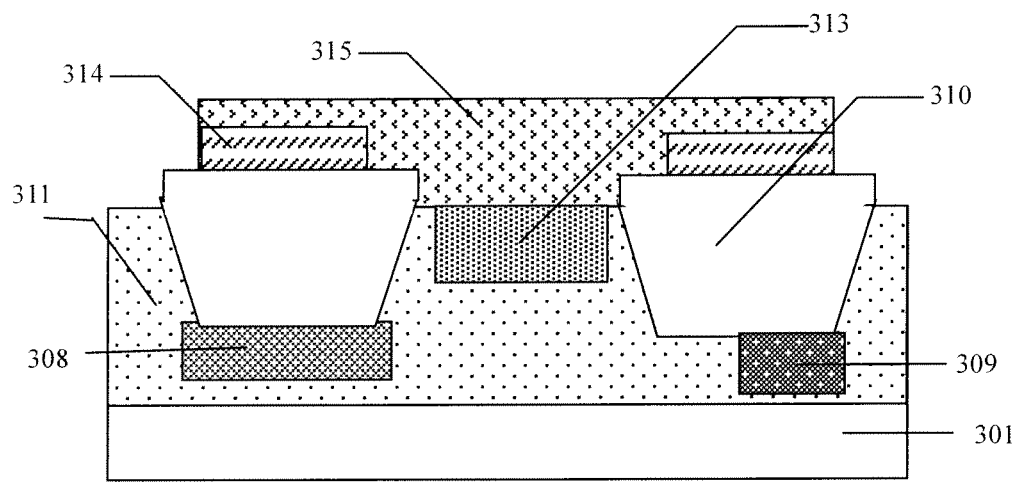
Figure 2J:
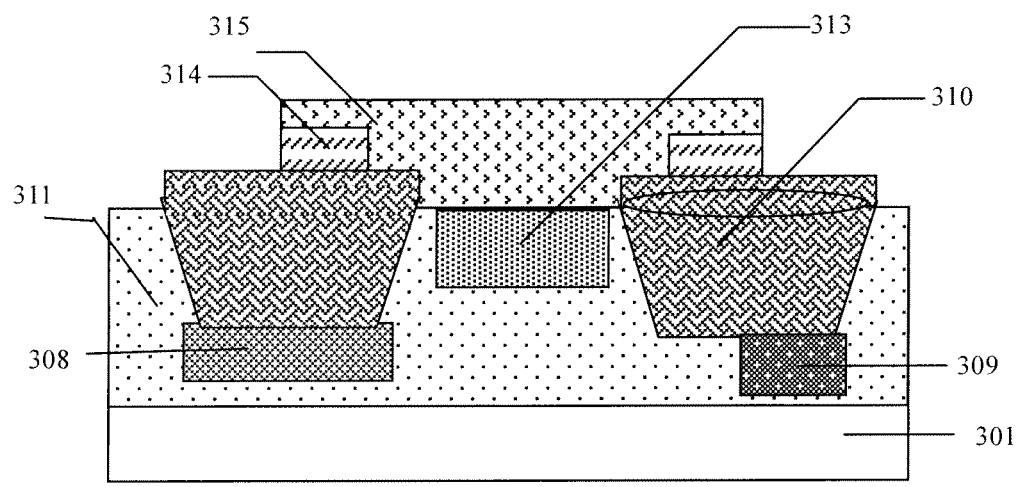

Step 15: as shown in FIG. 2I, grow a P-type silicon-germanium epitaxial layer on the silicon substrate 301. The P-type doping of the P-type silicon-germanium epitaxial layer adopts the P-type silicon-germanium extrinsic base ion implantation in a SiGe HBT process. The process conditions are as follows: the implantation dose is larger than 1e15 cm$^{-2}$; the impurity implanted is boron or boron difluoride; the implantation energy is selected to make sure that ions are able to go through the P-type silicon-germanium epitaxial layer and enter into the active area below the P-type silicon-germanium epitaxial layer by a depth of 100 Å to 500 Å, or in other words, reach a depth of 100 Å to 500 Å in the active area. Then, etch the P-type silicon-germanium epitaxial layer and the extrinsic base dielectric layer 314 below it to form an emitter region 315.

Step 16: grow silicon oxide on the substrate 301 to form an interlayer film 317.

Step 17: etch the interlayer film 317 and the shallow trench field oxides 310 to form a deep hole on top of the N-type pseudo buried layer 308 and the collector region 309, respectively.

Step 18: etch the interlayer film 317 to form contact holes on top of the emitter region 315.

Step 19: deposit a titanium/titanium nitride barrier metal layer into the deep holes and the contact holes and then fill the deep holes and the contact holes with tungsten to form deep hole contacts 318 and metal contacts 316, respectively.

Step 20: deposit and etch metals to form interconnections of the device.

While the present invention has been particularly shown and described with reference to the above embodiments thereof, it will be understood by those skilled in the art that various changes in form and details may be made without departing from the spirit and scope of the invention.

What is claimed is:

1. A parasitic PNP bipolar transistor in a silicon-germanium BiCMOS process, formed on a P-type silicon substrate, in which an active area is isolated by shallow trench field oxides, the PNP bipolar transistor comprising:
a base region, composed of a first region and a second region, the first region being formed by a first N-type ion implantation region in the active area, the first region having a depth larger than that of the bottom of the shallow trench field oxides, a bottom part of the first region laterally extending into the bottom of the shallow trench field oxides on both sides of the active area, the second region being formed by a second N-type ion implantation region formed in an upper part of the first region, the second region having a doping concentration higher than that of the first region and a depth smaller than that of the bottom of the shallow trench field oxides;
an N-type pseudo buried layer, formed by a third N-type ion implantation region formed at the bottom of the shallow trench field oxide on one side of the active area, the N-type pseudo buried layer being in contact with the first region, a base electrode being picked up through a deep hole contact formed on top of the N-type pseudo buried layer in the respective shallow trench field oxide;
a collector region, formed by a P-type pseudo buried layer formed at the bottom of the shallow trench field oxide on the other side of the active area, the P-type pseudo buried layer being separated from the active area by a lateral distance, the P-type pseudo buried layer being in contact with the bottom part of the first region that laterally extends into the bottom of the shallow trench field oxides, a collector electrode being picked up through a deep hole contact formed on top of the P-type pseudo buried layer in the respective shallow trench field oxide, wherein by adjusting the lateral distance between the P-type pseudo buried layer and the active area, a bottom width of the bottom part of the first region can be adjusted, and hence a breakdown voltage of the parasitic PNP bipolar transistor can be adjusted;
an emitter region, formed by a P-type silicon-germanium epitaxial layer formed on top of the active area and being in contact with the second region, an emitter electrode being picked up by a metal contact.

2. The parasitic PNP bipolar transistor in a silicon-germanium BiCMOS process according to claim 1, wherein process conditions of the first N-type ion implantation of the first region are as follows: implantation dose is 1e12 cm$^{-2}$ to 5e14 cm$^{-2}$; implantation energy is 50 KeV to 500 KeV; implantation window has a width larger than that of the active area.

3. The parasitic PNP bipolar transistor in a silicon-germanium BiCMOS process according to claim 1, wherein process conditions of the second N-type ion implantation of the second region are as follows: single implantation or multiple implantations; total implantation dose is 5e12 cm$^{-2}$ to 1e14 cm$^{-2}$; implantation energy is 10 KeV to 100 KeV; implantation window has a width smaller than or equal to that of the active area.

4. The parasitic PNP bipolar transistor in a silicon-germanium BiCMOS process according to claim 1, wherein the N-type pseudo buried layer is formed by a third N-type ion implantation conducted before forming the shallow trench field oxides, and the process conditions of the third N-type ion implantation are as follows: impurity implanted is arsenic or phosphorous; implantation dose is larger than 5e14 cm$^{-2}$; implantation energy is 1 KeV to 100 KeV.

5. The parasitic PNP bipolar transistor in a silicon-germanium BiCMOS process according to claim 1, wherein the P-type pseudo buried layer of the collector region is formed by a P-type ion implantation conducted before forming the shallow trench field oxides, and the process conditions of the P-type ion implantation are as follows: impurity implanted is boron or boron difluoride; implantation dose is 1e13 cm$^{-2}$ to 1e16 cm$^{-2}$; implantation energy is 1 KeV to 100 KeV.

6. The parasitic PNP bipolar transistor in a silicon-germanium BiCMOS process according to claim 1, wherein the P-type silicon-germanium epitaxial layer is doped by an ion implantation process with conditions as follows: implantation dose is larger than 1e15 cm$^{-2}$; impurity implanted is boron or boron difluoride; implantation energy is configured such that the impurities implanted can go through the P-type silicon-germanium epitaxial layer and enter into the active area below the P-type silicon-germanium epitaxial layer by a depth of 100 Å to 500 Å.

7. The parasitic PNP bipolar transistor in a silicon-germanium BiCMOS process according to claim 1, wherein the deep hole contact is formed by opening a deep hole in the shallow trench field oxide, depositing a titanium/titanium nitride barrier metal layer in the deep hole, and filling tungsten into the deep hole.

* * * * *